April 26, 1960 E. S. MILLER ET AL 2,934,714

POWER AMPLIFIER

Filed Aug. 26, 1957

INVENTORS
Edward S. Miller
Robert M. Grodinsky
By Wallenstein & Spangenberg
attys.

United States Patent Office
2,934,714
Patented Apr. 26, 1960

2,934,714

POWER AMPLIFIER

Edward S. Miller, Highland Park, and Robert M. Grodinsky, Deerfield, Ill., assignors to Sherwood Electronic Laboratories, Inc., Chicago, Ill., a corporation of Illinois Application August 26, 1957, Serial No. 680,105
10 Claims. (Cl. 330—134)

This invention relates to power amplifiers, particularly, but not necessarily, to electron tube power amplifiers used in high fidelity sound amplifier equipment, wherein one of the prime considerations is the provision of maximum power output with minimum distortion.

In recent years, the demand for high fidelity sound equipment has greatly increased, particularly so in middle income families. The cost of such equipment is, therefore, a very important consideration, and sound equipment manufacturers are continuously seeking ways and means of reducing costs without, however, sacrificing the high fidelity characteristics of the equipment.

In addition to the obviously desirable characteristic of wide frequency response, true high fidelity requires low distortion at high power output levels and low hum or noise levels. The output capabilities of high fidelity sound equipment are generally specified in terms of maximum watts output where the distortion level is at or below a specified limiting distortion level. To increase the wattage output of the amplifier without increasing the distortion level has heretofore required a significant increase in cost of the equipment brought about by either the use of more expensive electron tubes with higher power output capabilities and/or the addition of various other components which reduce distortion.

Before discussing the objects and advantages of the present invention, a brief discussion of the factors affecting distortion will be given. Where a single tube power amplifier circuit is utilized, it is apparent that the driving of the power amplifier tube far into its lower non-linear regions of operation will result in substantial distortion in the output signal waveform. The degree to which such a tube can be driven without exceeding a limiting distortion level is obviously tied in very directly with the length of the linear and near-linear portions of its output current vs. signal input curve. When a single tube is being operated in its linear region of operation, it is operating class A, and, when it is driven to a point where the maximum negative swing of the signal drives it through its low non-linear region into a plate current cut-off condition, it is being operated class AB or class B. Distortion increases as the operation of the tube is varied from a given class A condition toward a class AB or class B condition. An increase in the grid to cathode bias of a tube originally operating in a given linear or near-linear class of operation will thereby shift the class of operation toward a class AB and more non-linear condition of operation.

The use of two power amplifier tubes connected in push-pull enables the tubes to be operated well into their non-linear regions, considering the tubes individually, while providing an over-all linear or low distortion output to input signal characteristic, considering the output across the secondary winding of the output transformer commonly used in such circuits. When the grid-to-cathode bias conditions permit both tubes to draw plate current at all times and the input signal does not drive the grids positive, the amplifier is said to be operating class A and with correspondingly relatively small distortion. When the bias level is such that the input signal drives the tubes to cut-off, they are operating class AB or B. As in the case of single tube operation, it is a valid generalization to state with a push-pull amplifier that distortion increases as the condition of the tubes is varied from a given class A operating condition toward a class AB or B operating condition, obtained, for example, by an increase in the grid-to-cathode bias of the tubes.

In both single tube and push-pull power amplifier circuits, the average value of plate current increases from a no-signal to a signal condition if the tubes, considered singly, are driven into their lower non-linear regions of operation. If ordinary cathode bias is utilized, wherein the bias voltage is developed solely by the flow of plate current through a cathode circuit impedance, then the resulting shift of cathode bias under a signal condition results in a shift from a theoretical class of operation, based on the no-signal cathode bias, toward or farther into a class AB or class B state of operation with a consequent increased distortion for a given input signal. This fact has been well known, and various means, therefore, have been heretofore developed for stabilizing the bias of the power output tubes of high-fidelity amplifiers. The present invention offers a new and improved circuit for stabilizing the cathode bias.

As indicated above, in addition to the problem of output distortion, the problem of hum or noise level is also an important consideration in high fidelity sound equipment. Most of the hum or noise originates in the pre-amplifier stages of a high fidelity amplifier, since the noise originating therein is amplified to the greatest extent. One source of noise in an amplifier is indirectly due to the fluctuating component of the current used to heat the filaments of electron tubes. Accordingly, the filaments, particularly of the preamplifier tubes, are sometimes heated by well-filtered direct current. In the interest of economy, it has heretofore been proposed to utilize the plate current of the power amplifier tube or tubes to heat the filaments of the pre-amplifier tubes. For best operation and long life, manufacturers of electron tubes usually recommend that the filaments be operated at certain current levels. If the current is increased significantly above the rated value, then the life of the tube is greatly affected, and, if the current is significantly below the rated amount, insufficient electron emission will result with reduced amplification and increased distortion and unduly lengthened warm-up time. Usually, the plate current levels found in power amplifiers, particularly in the 20 watt and under amplifiers, were significantly under the recommended current ratings of the tube filaments even when two push-pull connected tubes are used in the power amplifier stage, so that heating the tube filaments with such plate current resulted in a substantially less-than-ideal operation of the pre-amplifier tubes. Sometimes the filaments were damaged by excessive plate current flow brought about by control grid emission.

An additional factor increasing warm-up time, is that the power amplifier tube filaments must heat up before the plate current heating the pre-amplifier tube filaments reaches its normal value. It was not uncommon to have warm-up times of 20 seconds or more which was disturbing to many users of this equipment.

It is one of the primary objects of the present invention to provide a power amplifier circuit having a stabilized bias voltage in a novel and unique way and which, at the same time, enables the proper heating of the pre-amplifier tube filaments by a plate current of the power amplifier, even though the plate current is not at or near the rated value of the filaments. A further object of the invention is to heat the pre-amplifier filaments with plate current in a novel power amplifier cathode circuit designed to stabilize current flow through the filaments in spite of wide fluctuations in a plate current. Another object of the present invention is to provide a high-fidelity sound amplifier which enables a substantial increase in wattage output thereof for a given limiting distortion level and with a low noise level, at a significantly lower cost than was heretofore possible using prior bias voltage stabilization and pre-amplifier filament heating techniques.

In its most preferred form, the present invention utilizes a push-pull arrangement of power amplifier tubes having a novel and improved cathode circuit design including the filaments of the pre-amplifier tubes and, in most cases, additional resistance means. The effective resistance of the cathode circuit including said pre-amplifier filaments and resistance means is such that the current flowing through the filaments is less than the rated amounts therefor. Any deficiency in cathode bias and filament current is supplied by an external source of direct current voltage. This source of direct current voltage may include the output winding of a full wave rectifier circuit used for providing plate or bias voltage for the tubes of the amplifier circuit. Usually, such a circuit uses a transformer where the center point of the secondary winding thereof is grounded. According to a specific aspect of the present invention, connections are made from the cathode circuit of the power amplifier tubes through respective rectifiers (preferably of the semi-conductor type, such as selenium rectifiers, because of their inexpensiveness and high current capacity for short time intervals) to points on the secondary winding of the rectifier circuit transformer spaced equidistant from and on opposite sides of the grounded center point thereof. The rectifiers are similarly polarized to pass current in a direction which will send current through the cathode circuit in the same direction as the flow of plate current therein. Suitable filtering means are provided to filter out any significant ripple from the rectifier outputs. The filtering means preferably is a filter capacitor connected to the output of the rectifier, and a capacitor connected across the cathode circuit filaments. Most preferably, the tap-off points on the power transformer are made at points which will provide, after suitable filtering, a direct current voltage equal to the desired bias voltage for the power amplifier tubes. In such case, the above-mentioned rectifiers are connected to the cathodes of the power amplifier tubes or to points near cathode potential so that voltage of the entire cathode circuit is stabilized at the desired level.

The resistance means in the cathode circuit is of such value and is so arranged that, at the voltage applied to the cathode circuit by said external source of direct current voltage, the current flowing through the filaments is near their rated value. Thus, with this arrangement, not only is stabilization of the bias of the power amplifier tube obtained, but the stabilization of the current flow through the preamplifier filaments is obtained at the desired current rating thereof. When the amplifier is initially turned on, very little current is supplied to these filaments by the plate current of the power amplifier, and the required current will be provided from the external source of voltage. Since cold electron tube filaments have a very low resistance relative to their normal hot resistance, relatively large currents are initially supplied through the semi-conductor rectifiers of the external voltage source. Such rectifiers have the advantage of high current capacities for short periods. The heating up of the preamplifier filaments need not wait, therefore, for the heating up of the power amplifier tubes, thereby substantially reducing the over-all warm-up time of the amplifier. Furthermore, the filaments are being operated at their rated values so that maximum life and optimum operation thereof is ensured. Since, under normal operating conditions, the selenium rectifiers supply only part of the current needed for the filaments, the semi-conductor rectifiers may have a low current rating relative to the current required by the filaments.

In its broader aspect, the present invention contemplates the use of only a single power amplifier tube rather than a push-pull arrangement of two tubes and also the use of only one rather than two filter capacitors. Also, theoretically at least, a direct current battery source for the external current-producing means may be used as the external voltage source. In the latter case, a capacitor for filtering out audible frequencies from the pre-amplifier filaments would be unnecessary. It may, however, be desirable to include a capacitor in the cathode circuit for other reasons. Also, although the present invention has its most practical application where the plate current of the power amplifier tubes is substantially less than the rated current for the pre-amplifier filaments to be heated thereby, the invention also has utility in reducing warm-up time and stabilizing cathode bias and filament current where the plate current is greater than the current required by these filaments.

For a fuller explanation of the present invention, reference should now be made to the specification and the drawings wherein.

Figures 1, 2, 3, 4:
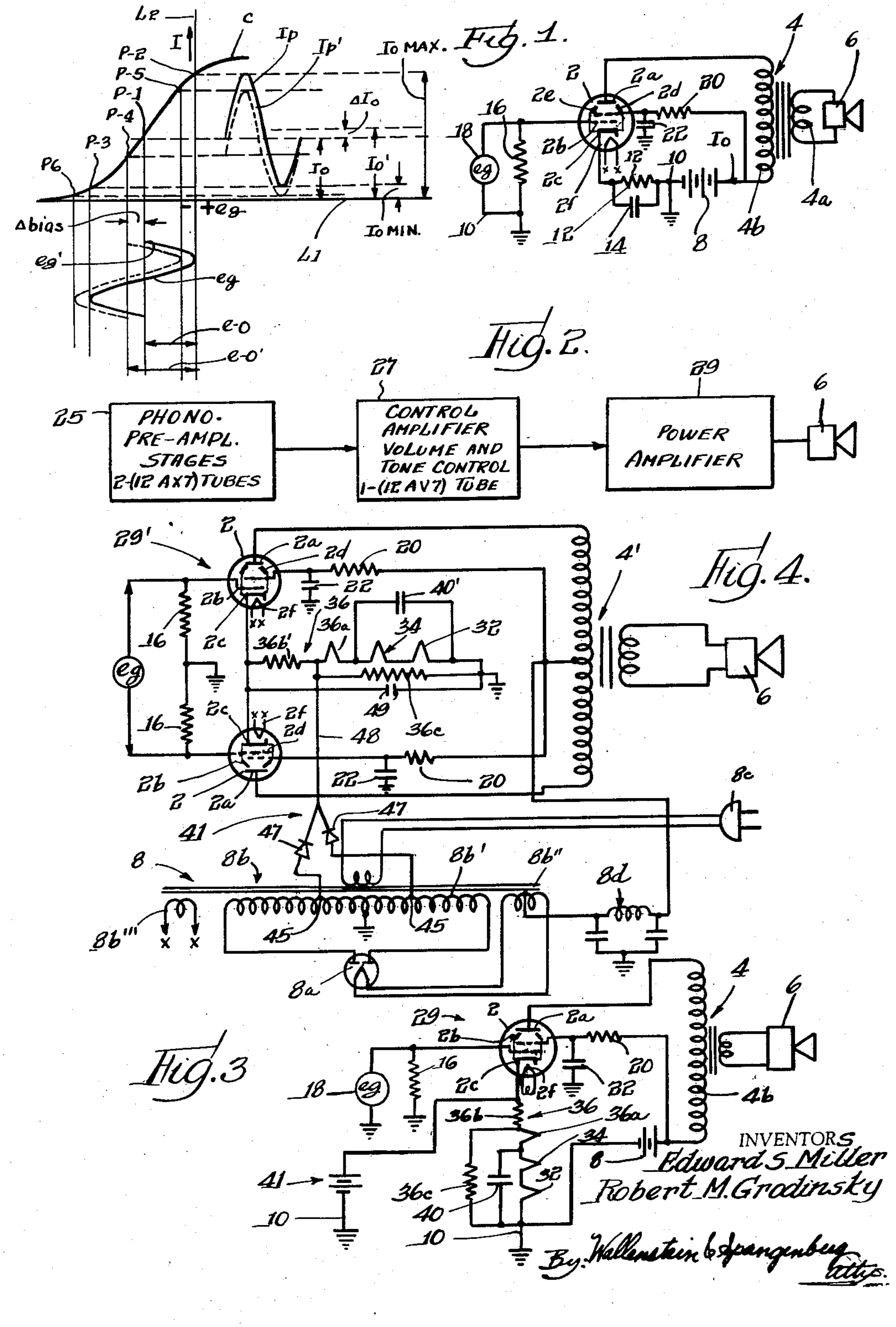
Fig. 1 shows a single tube power amplifier circuit and the output current vs. input current characteristic thereof.
Fig. 2 is a box diagram showing stages commonly found in high fidelity and sound amplifiers.
Fig. 3 shows a single tube power amplifier circuit which incorporates the novel and improved cathode circuit of the present invention.
Fig. 4 shows a push-pull power amplifier which incorporates the present invention in its most preferred form.

Refer now to Fig. 1 which shows a conventional type single tube power amplifier circuit and the tube characteristic thereof. As there shown, the power amplifier circuit includes an electron vacuum tube 2, which will be sometimes referred to as an electron tube device or means. The electron tube may be any one of a number of well known power amplifier tubes, such as the type 6L6 beam power tube. Such tube has a plate electrode 2*a*, a control grid electrode 2*b*, a cathode electrode 2*c*, a screen electrode 2*d*, beam forming plates 2*e*, and filament 2*f*. The plate electrode 2*a* is connected through a step-down output transformer 4 whose secondary winding 4*a* is connected to a suitable speaker system 6. The primary winding 4*b* thereof is connected to a suitable source of positive direct current voltage 8 whose negative terminal is usually connected to ground or some other reference or common point 10. The cathode electrode 2*c* is connected to the common point 10 through a cathode resistor 12 shunted by a suitable filtering capacitor 14. The input circuit of the tube extends from the control grid electrode 2*b* through a suitable resistor 16 to ground 10. A suitable source of driving voltage 18 is connected across the resistor 16, and is usually the output circuit of a control amplifier tube or a pre-amplifier tube. A voltage dropping resistor 20 is connected between the screen electrode 2*d* and the positive terminal of the source of direct current voltage 8, and an isolating or filter capacitor 22 is connected between the screen electrode and ground. The filament 2*f* may be connected to a conventional filament transformer.

A typical tube characteristic curve C for the power amplifier tube 2 is shown in Fig. 1. The line L1 therein represents units of the net voltage applied between the grid and cathode electrodes and the line L2 represents the output plate current for such voltage. When the output of the grid driving voltage source 18 is zero, the plate current will stabilize at a value I*o* represented by the ordinate of point P–1 on the characteristic curve C. At that point, the grid to cathode voltage has a value *e—o* which is equal to the plate current times the resistance of cathode resistor 12. When the output of the driving voltage source 18 appears across grid resistor 16, the output being represented by the solid curve *eg*, the net grid to cathode voltage is the bias voltage developed across the resistor 12 plus the driving voltage. It can be seen that during the first cycle of the driving voltage, the maximum positive swing of the driving voltage would appear to produce a maximum current I*o* max. represented by the ordinate of point P–2 on the curve C, and the maximum negative swing of this voltage source would appear to produce a minimum current I*o*-min. represented by the ordinate of point P–3 on the latter curve. If the output current waveform is traced, the waveform will appear as a curve I*p*. In the example being illustrated, the power amplifier tube is driven into a non-linear portion of the curve C, at the lower or cut-off end thereof, wherein the bottom half of the plate current waveform produced by the negative half cycle of the driving voltage *eg* will be distorted or flattened. It can be shown that this non-linear operation will actually cause the average plate current flow to increase, for example, to a value of I*o'*, which means that the average cathode bias voltage developed across the resistor 12 will increase, accordingly, from the no-signal condition bias. Therefore, the median swing of the grid driving voltage *eg* will change from *e—o*, the abscissa of point P–1 on the curve C, to a value *e—o'* identified by the abscissa of point P–4, so that the negative going swing of the driving voltage source represented by dotted curve *eg'* then will drive the tube further into its non-linear region of operation, closer to a class AB type of operation. The maximum swing of the net grid to cathode voltage under the load bias identified by the point P–6 on the curve C. This will result in greater distortion in the output current of the amplifier as shown by the dotted current waveform I*p'*. In order to stay within a certain minimum distortion limit, it can be seen that with the arrangement shown in Fig. 1, the maximum swing in the driving voltage permissible for a given distortion level will be much less than is theoretically possible because of the change in the bias level of the tube 2. This means that the permissible amplitude of the output signal of the amplifier for a given distortion limit will be that much less than is theoretically possible. Since power is a function of the square of the output current, it can be readily seen that the power output capabilities of a given tube having the above-mentioned shift in the cathode bias voltage can be substantially less than is theoretically possible in the absence of a stabilization of the bias voltage of the tube 2. Thus, if some means were provided for keeping the cathode bias voltage at a level *e—o* independently of the amplitude of the driving voltage, the tube can be driven to its maximum theoretical limit for a given limiting distortion level.

Before describing the manner in which the present invention stabilizes the grid voltage, reference should be made to Fig. 2 which shows in box diagram form a typical high-fidelity amplifier circuit. Generally, one or more pre-amplifier stages 25 are provided for amplifying the voltage generated in the pick-up head of a phonograph pick-up arm. One typical tube type which can be used in these pre-amplifier stages is the type 12AX7 which has two 6.3 volt filament sections which can be connected in series. These filament sections will be assumed to be in series connected and will be indicated in the drawings as a single 12.6 volt filament. The current rating for such 12AX7 filaments is in the neighborhood of 150 ma. (It should be understood that the present invention is not limited to a particular tube type, but that the type 12AX7 is merely selected for purposes of illustration.)

The output of the pre-amplifier stages 25 is generally fed to what may be referred to as a control amplifier stage 27. The control amplifier actually has a relatively small amplification factor and is part of volume and tone control circuit. This circuit may use a type 12AV7 tube which has a 12.6 volt filament circuit also rated at about 150 ma. The output of the control amplifier 27 leads to the input of a power amplifier stage 29 which, in most cases, would be a push-pull amplifier, but which will now be described as a single tube push-pull amplifier to exemplify a simple form of the present invention.

As above indicated, because of the high amplification of the signals introduced in the pre-amplifier stages, to avoid high amplification of frequencies in the power frequency range, it is desirable to heat the filaments of the pre-amplifier tubes with direct current, which may be the plate current of the tube or tubes of the power amplifier stage 29. Where the power amplifier tube is a type 6L6, the plate current is in the neighborhood of only 40 to 60 ma. This arrangement is shown in Fig. 3, which additionally incorporates features of the present invention by means of which the bias voltage of the power amplifier tube and also the current flow through the filaments of the pre-amplifier stages are stabilized at their rated values.

Referring to Fig. 3, the power amplifier circuit 29 there shown is the same as that shown in Fig. 1 except for the cathode circuit, that is the circuit extending between the cathode electrode 2*c* and the common or ground point 10. This cathode circuit includes filaments of the pre-amplifier 12AX7 tubes, identified by reference numerals 32 and 34, respectively, and resistance means generally indicated by the reference numeral 36. This resistance means may include the filament 36*a* of the control amplifier tube, which, as above indicated, may be a type 12AV7 tube rated at 12.6 volts at 150 ma. The resistance means 36 also preferably includes a resistor 36*b* connected between the filament 36*a* and the cathode electrode 2*c*, and also a relatively large resistor 36*c* connected across the filaments 32, 34 and 36*a*. A filter capacitor 40 is shown connected in parallel with the pre-amplifier tube filaments 32 and 34.

To stabilize the cathode bias voltage, an external current or voltage source, generally indicated by the reference numeral 41, is provided which most advantageously provides a direct current voltage equal to the desired cathode bias voltage. This current or voltage-producing means may, in a broad aspect of the invention, be any source of direct current voltage. Where the external voltage source has any significant ripple component at an audible frequency, an additional filter capacitor, not shown, may be added across the external voltage source 41. The filter capacitor 40 may be present primarily to avoid cathode degeneration at the signal frequencies, but it also can be provided to aid in filtering any ripple components in the output of voltage source 41 from the pre-amplifier filaments. The external voltage source 41 is preferably connected between the cathode electrode 2*c* or a point near cathode potential and the common or ground point 10 of the amplifier, and is polarized so that the current produced thereby in the cathode circuit is in the same direction as the flow of plate current in the cathode circuit. With this arrangement, voltage source 41 need only supply an increment of current which, in addition to the plate current, will produce a voltage drop across the cathode circuit equal to the desired bias voltage. If the average plate current should decrease for any reason, the external voltage source 41 will supply the necessary current to maintain the cathode bias voltage at the value of the output voltage of the external voltage source 41.

The value of the resistors 36*b* and 36*c* are selected so that the current flow in the cathode circuit will be equal to the rated value of the filaments 32 and 34. Where the plate current is less than the current required by the filaments 32 and 34, the resistor 36*c* serves the purpose of providing a current path for plate current if one of the filaments 32 or 34 should burn out. Without resistor 36*c*, the burning out of one of these filaments would place the full output of voltage source 8 across the capacitor 40 and the capacitor would, therefore, need to be a high voltage capacitor. If the plate current were greater than the current required by these filaments, shunt resistor 36c would be of a value to reduce the plate current flow under both no-signal and signal conditions below that required, so that the external voltage source 41 could be used to regulate both cathode circuit current and voltage.

In the example being described, the pre-amplifier filaments 32 and 34, and the filament 36a for that matter, all require about 150 ma. Where the power amplifier tube is a 6L6 tube whose plate current is in the neighborhood of 55 ma., it can be seen that the current-generating means 41 will supply approximately 95 ma. of current.

With the arrangement just described, as soon as the amplifier is turned on, the filaments 32 and 34 and 36a will immediately receive a large surge of current from voltage source 41, so that the warm-up time of the pre-amplifier tubes is not delayed by the warm-up time of the power amplifier tube 2. Moreover, by the means just described, not only is the cathode bias voltage stabilized, but the pre-amplifier filaments 32 and 34 receive their rated current even though the plate current of the power amplifier is below the current required for optimum operation of the pre-amplifier tubes.

Due to the present invention, at a small additional cost, an amplifier which is normally designed for operation as a 20 watt amplifier at a given distortion level can produce an output of 35 watts at no greater distortion level and at a very nominal cost. The output level of 35 watts cannot be obtained, however, with tubes now commonly available without a push-pull power amplifier arrangement.

Reference should now be made to Fig. 4 which shows a preferred form of the invention utilizing a push-pull power amplifier 29' using two power amplifier tubes, 2—2, which may be the same 6L6 beam power tubes previously described. In such a circuit, the cathode electrodes 2c—2c of the tubes 2—2 are connected together, the plate electrodes 2a—2a are connected to opposite ends of an output step-down transformer 4', the grid electrodes 2b—2b are connected to respective resistors 16—16 whose common ends are grounded, and the screen grid electrodes 2d—2d are connected to capacitors 22—22 and resistors 20—20 in the same manner as in the previously described embodiments. The plate voltage 8 for the power amplifier tubes 2—2 may be derived from a conventional full-wave rectifier circuit operated from a 60-cycle power line. The rectifier circuit includes a power rectifier tube 8a whose anode electrodes are connected to the opposite ends of the main secondary winding 8b' of a power transformer 8b whose primary winding is connected to a suitable plug connector 8c leading to a 60-cycle power line. The center point of the main secondary winding 8b' of the power transformer is grounded. The power transformer further includes one or more filament windings 8b'' and 8b''', the winding 8b'' connecting to the filament of the full-wave rectifier 8a and having a center tap which extends to a conventional filtering network circuit 8d which provides filtered direct current voltage at its output. The secondary winding 8b''' may be a filament transformer winding connected to the filaments 2f—2f of the tubes 2—2. One terminal of the filter network 8d is grounded and the other end is connected to the plate circuits of the various tubes to be used in the amplifier. As shown in Fig. 4, the output of the filter 8d is connected to the center tap point of the input winding of the output transformer 4'. The screen circuit resistors 20—20 are also connected to this point.

The cathode circuit of the power amplifier is connected between the cathode electrodes 2c—2c of the power amplifier tubes 2—2 and ground. This cathode circuit may be similar to that previously described in connection with the embodiment of Fig. 3 and, therefore, may include in series circuit relation the pre-amplifier tube filaments 32 and 34 of a tube, such as type 12AX7, and resistance means generally indicated by the reference numeral 36, which may include filament 36a of the control amplifier tube (such as a type 12AV7 tube), series resistor 36b' and shunt resistor 36c. A filter capacitor 40' is connected across the filaments 32 and 34.

This push-pull circuit works particularly well with the tube types now generally available on the market, such as power amplifier tube type 6L6, pre-amplifier tube types 12AX7 and control amplifier tube type 12AV7. The 12AX7 tube has a 12.6 volt filament circuit requiring 150 ma. The combined plate currents of the 6L6 power amplifier tubes is somewhat under 150 ma., so that the current or voltage-generating means to be connected to the cathode circuit for voltage stabilization can supply the differences between the combined plate currents of the power amplifier tubes and the current required by the filaments 32 and 34.

In order to minimize the number of additional components required to fabricate the push-pull power amplifier circuit of the present invention, it is desirable to utilize tap-off points on the main output winding 8b' of the power transformer 8b to derive the cathode bias stabilizing voltage. These tap-off points are made at corresponding points 45—45 spaced equi-distant from and on opposite sides of the grounded center tap point thereof. Connected to these points are respective semi-conductor type rectifiers 47—47 which are polarized to pass current to the cathode circuit electrodes in the same direction as plate current flows in the cathode circuit. Such rectifiers commonly have relatively low impedances so that the external fixed bias source including the rectifiers is a low impedance voltage source with good regulation having a voltage at or near the level at which cathode bias stabilization is desired. Rectifiers 47—47 are connected together and then, via lines 48 and 48', to the above mentioned cathode electrodes 2c—2c. The full wave rectified voltage occurring at the output of these rectifiers is filtered by a suitable filter capacitor 49 connected between the cathode electrodes and ground. In addition to acting as a filter capacitor, capacitor 49 prevents any appreciable cathode degeneration. To eliminate substantially any 120 cycle component from the pre-amplifier filaments 32 and 34, which would produce hum in the output of the power amplifier, the filter capacitor 40' is also preferably provided. The cathode circuit resistor 36b' is sized so that the current flowing through the cathode circuit at the desired cathode bias voltage level across the cathode circuit is at current or near the rating of the filaments 32 and 34, namely 150 ma. in the above example.

The various parameters of the circuit in the embodiment of Fig. 4 may be as follows:

| | | |
|---|---|---|
| Screen to ground operating voltage | volts | 475 |
| Plate to ground operating voltage | do | 480 |
| B plus supply (D.C. output voltage of the filter 8d) | volts | 490 |
| Current through filaments | ma | 150 |
| Zero signal plate current | ma | 80 |
| Operating plate current | ma | 120 |
| Resistor **36b'** | ohms | 60 |
| Resistor **36c** | do | 2000 |
| Capacitor **40** | microfarads | 150 |
| Capacitor **49** | do | 150 |
| Stabilized cathode bias voltage | volts | 50 |

It can thus be seen that the present invention provides at a very slight increase in cost cathode voltage stabilization of the power amplifier in a manner which minimizes warm-up time and provides the optimum rate of current for the filaments of the pre-amplifier tubes.

It should be understood that numerous modifications may be made in the embodiments of the invention described without deviating from the broad aspects of the invention. For example, where the voltage between the cathode electrode and ground is stabilized at a value above the desired cathode to grid bias level, the grid circuit may be connected to a tap-off point in the cathode to ground circuit which is above ground potential.

We claim as our invention:

1. In an amplifier having pre-amplifier means including electron tube amplifying means with electron-generating filament means and power amplifier means including electron tube amplifying means with an output current vs. signal input characteristic with a non-linear section at the cut-off end thereof and including plate, indirectly heated cathode and control grid electrode means, an output plate circuit connected between said plate electrode means and a common point and including a load device and a source of direct current plate voltage, and a signal input circuit connected between said grid electrode means and said common point, the improvement comprising: a cathode circuit connected between said cathode electrode means and said common point and including said filament means of said pre-amplifier electron tube means which is arranged to be heated by the plate current of said power amplifier electron tube means, the voltage drop across said cathode circuit constituting at least part of the grid to cathode bias of said latter electron tube means, and means for stabilizing the cathode bias voltage developed in said cathode circuit so that it is substantially independent of any variation in the average value of the plate current brought about by the driving of said power amplifier electron tube means into said non-linear region of operation thereof, said stabilizing means including a source of fixed bias voltage having a value near the value of the cathode bias voltage desired and connected through a relatively low impedance path to said cathode circuit including said filament means in said cathode circuit for providing the desired bias for said power amplifier electron tube means.

2. In an amplifier having pre-amplifier means including election tube amplifying means with electron-generating filament means and power amplifier means including electron tube amplifying means with an output current vs. signal input characteristic with a non-linear section at the cut-off end thereof and including plate, indirectly heated cathode and control grid electrode means, an output plate circuit connected between said plate electrode means and a common point and including a load device and a source of filtered and rectified plate voltage, and a signal input circuit connected between said grid electrode means and said common point, a source of driving signal voltage of varying amplitude to be amplified by said power amplifier electron tube means and which drives said latter tube means into said non-linear section of operation thereof, said source of signal voltage coupled to said signal input circuit, the improvement comprising: a cathode circuit connected between said cathode electrode means and said common point and including said filament means of said pre-amplifier electron tube means which is arranged to be heated by the plate current of said power amplifier electron tube means, the voltage drop across said cathode circuit constituting at least part of the grid to cathode bias of said latter electron tube means, means for stabilizing the cathode bias voltage developed in said cathode circuit so that it is substantially independent of any variation in the average value of the plate current brought about by the driving of said power amplifier electron tube means into said non-linear region of operation thereof, said stabilizing means including a source of rectified alternating current voltage coupled through a relatively low impedance path to said cathode circuit including said filament means in said cathode circuit for providing a stabilized bias for said power amplifier electron tube means and for supplying a stabilized current for said filament means, and filter capacitor means coupled across said filament means for substantially eliminating any hum-producing component in the current fed to the cathode circuit from said sources of rectified voltage.

3. In an amplifier having pre-amplifier means including electron tube amplifying means with electron-generating filament means and power amplifier means including electron tube amplifying means with an output current vs. signal input characteristic with a non-linear section at the cut-off end thereof and including plate, indirectly heated cathode and control grid electrode means, an output plate circuit connected between said plate electrode means and a common point and including an output step-down transformer and a source of direct current plate voltage, a speaker system coupled to the output of said transformer, and a signal input circuit connected between said grid electrode means and said common point, a source of driving signal voltage of varying amplitude to be amplified by said power amplifier electron tube means and which drives said latter tube means into said non-linear section of operation thereof, said source of signal voltage being coupled to said signal input circuit, the improvement comprising: a cathode circuit connected between said cathode electrode means and said common point and including said filament means of said pre-amplifier electron tube means which is arranged to be heated by the plate current of said power amplifier electron tube means, the voltage drop across said cathode circuit due to plate current of said latter tube means providing less than the desired amount of cathode bias therefor, and the value of the plate current passing through said filament means being less than the rated current therefor, and means for stabilizing the cathode bias voltage developed in said cathode circuit at the desired cathode bias level so that it is substantially independent of any variation in the average value of the plate current brought about by the driving of said power amplifier electron tube means into said non-linear region of operation thereof and for increasing the level of current flowing through said filament means to bring it nearer the rated current value therefor, said stabilizing means including a source of fixed bias voltage coupled through a relatively low impedance path across said cathode circuit including said filament means.

4. In an amplifier having pre-amplifier means including electron tube amplifying means with electron-generating filament means and power amplifier means including electron tube amplifying means with an output current vs. signal input characteristic with a non-linear section at the cut-off end thereof and including plate, indirectly heated cathode and control grid electrode means, an output plate circuit connected between said plate electrode means and a common point and including a load device and a source of rectified and filtered alternating current plate voltage, and a signal input circuit connected to said grid electrode means, the improvement comprising: a cathode circuit connected between said cathode electrode means and said common point and including said filament means of said pre-amplifier electron tube means which is arranged to be heated by the plate current of said power amplifier electron tube means, means for stabilizing the voltage developed in said cathode circuit so that it is substantially independent of any variation in the average value of the plate current brought about by the driving of said power amplifier electron tube means into said non-linear region of operation thereof, said stabilizing means including a source of rectified alternating current voltage coupled to said cathode circuit so as to send current through said filament means in the same direction as the flow of plate current therethrough, for providing the desired bias for said power amplifier electron tube means, and filter capacitor means coupled across said filaments for filtering therefrom any fluctuating audible components in the current resulting from said alternating current voltage source.

5. In an amplifier having pre-amplifier means including electron tube amplifying means with electron generating filament means, and power amplifier means including electron tube amplifying means with an output current vs. signal input characteristic with a non-linear section at the cut-off end thereof and including plate, cathode and control grid electrode means, an output plate circuit connected between said plate electrode means and a common point and including an output step-down transformer to be connected to a speaker system and a source of direct current plate voltage, and a signal input circuit connected between said grid electrode means and said common point, a source of driving signal voltage of varying amplitude to be amplified by said power amplifier electron tube means with low distortion for a power output requiring said latter tube means to be driven into said non-linear section of operation thereof, said source of signal voltage being coupled to said signal input circuit, the improvement comprising: a cathode circuit connected between said cathode electrode means and said common point and including said filament means of said pre-amplifier electron tube means which is arranged to be heated by the plate current of said power amplifier electron tube means, the voltage drop across said cathode circuit supplying substantially all of the grid-to-cathode bias of said latter electron tube means, means for stabilizing the cathode bias voltage developed in said cathode circuit so that it is substantially independent of any variation in the average value of the plate current brought about by the driving of said power amplifier electron tube means into said non-linear region of operation thereof, said stabilizing means including a source of alternating voltage of a frequency in the audible range and having a value which when rectified and filtered will provide the desired cathode bias voltage for effecting the desired operation of the latter electron tube means, low impedance rectifier means, said source of alternating voltage being coupled through said rectifier means across said filament means, and filtering means in said cathode circuit for filtering out hum-producing components from said cathode circuit originating from said source of alternating voltage.

6. In an amplifier having pre-amplifier means including electron tube amplifying means with electron-generating filament means and power amplifier means including electron tube amplifying means with an output current vs. signal input characteristic with a non-linear section at the cut-off end thereof and including plate, cathode and control grid electrode means, an output plate circuit connected between said plate electrode means and a common point and including an output step-down transformer to be connected to a speaker system and a source of direct current plate voltage, and a signal input circuit connected to said electrode means, the improvement comprising: a cathode circuit connected between said cathode electrode means and said common point and including said filament means of said pre-amplifier electron tube means which is arranged to be heated by the plate current of said power amplifier electron tube means, resistance means connected in series with said filament means, means for stabilizing the voltage developed in said cathode circuit so that it is substantially independent of any variation in the average value of the plate current brought about by the driving of said power amplifier electron tube means into said non-linear region of operation thereof, said stabilizing means including an external source of alternating voltage of a frequency in the audible range, said source of alternating voltage being coupled through said rectifier means across said cathode circuit, and filter capacitor means in said cathode circuit coupled across said filament means for filtering out hum-producing components from said cathode circuit originating from said source of alternating voltage, and said resistance means being of a value that the current flowing through said filament means for the voltage applied to the cathode circuit by said external source of voltage is near the rated value of said filament means.

7. In an amplifier having pre-amplifier means including electron tube amplifying means with electron-generating filament means and power amplifier means including electron tube amplifying means with an output current vs. signal input characteristic with a non-linear section at the cut-off end thereof and including plate, cathode and control grid electrode means, an output plate circuit connected between said plate electrode and a common point and including an output step-down transformer to be connected to a speaker system and a source of direct current plate voltage, and a signal input circuit, the improvement comprising: a cathode circuit connected between said cathode electrode means and said common point and including said filament means of said pre-amplifier electron tube means which is arranged to be heated by the plate current of said power amplifier electron tube means, first resistance means connected in series with said filament means and second resistance means connected in parallel with said filament means, means for stabilizing the voltage developed in said cathode circuit so that it is substantially independent of any variation in the average value of the plate current brought about by the driving of said power amplifier electron tube means into said non-linear region of operation thereof, said stabilizing means including an external source of voltage, and said resistance means being of a value that the current flowing through said filament means for the voltage applied to the cathode circuit by said external source of voltage is near the rated value of said filament means.

8. In an amplifier having pre-amplifier means including electron tube amplifying means with electron-generating filament means and power amplifier means including electron tube amplifying means with an output current vs. signal input characteristic with a non-linear section at the cut-off end thereof and including plate, cathode and control grid electrode means, an output plate circuit connected between said plate electrode means and a common point and including an output step-down transformer to be connected to a speaker system and a source of direct current plate voltage, and a signal input circuit connected to said grid electrode means, the improvement comprising: a cathode circuit connected between said cathode electrode means and said common point and including said filament means of said pre-amplifier electron tube means which is arranged to be heated by the plate current of said power amplifier electron tube means, first resistance means connected in series with said fialment means and second resistance means connected in parallel with said filament means, the voltage drop across said resistance means and filament means constituting most of the grid-to-cathode bias of said latter electron tube means, means for stabilizing the cathode bias voltage developed in said cathode circuit so that it is substantially independent of any variation in the average value of the plate current brought about by the driving of said power amplifier electron tube means into said non-linear region of operation thereof, said stabilizing means including an external source of alternating voltage of a frequency in the audible range and having a value which when rectified and filtered will provide the desired cathode bias voltage for the latter electron tube means, semi-conductor rectifier means having a short-time high current capacity, but a long-time current capacity of a much lower value, said source of alternating voltage being coupled through said rectifier means across said cathode circuit, and respective filter capacitor means in said cathode circuit respectively coupled across the entire cathode circuit and across said filament means, for filtering out hum-producing components from said cathode circuit originating from said source of alternating voltage, and said resistance means being of a value that the current flowing through said filament means for the voltage applied to the cathode circuit by said external source of voltage is near the rated value of said filament means.

9. In a high-fidelity sound amplifier having preamplifier means including electron tube amplifying means with electron-generating filament means and power amplifier means including electron tube amplifying means with an output current vs. signal input characteristic with a non-linear section at the cut-off end thereof and including plate, indirectly heated cathode and control grid electrode means, an output plate circuit connected between said plate electrode means and common point and including load means including a speaker system and a source of direct current plate voltage, and a signal input circuit connected between said grid electrode means and said common point, a source of driving signal voltage of varying amplitude to be amplified by said power amplifier electron tube means with minimum distortion for a power output requiring said latter tube means to be driven into said non-linear section of operation thereof, said source of driving signal voltage being coupled to said signal input circuit, the improvement comprising: a cathode circuit connected between said cathode electrode means and said common point and including said filament means of said pre-amplifier electron tube means, the normal average value of the plate current of said power amplifier electron tube means being below the recommended value of current for said pre-amplifier electron tube means and the voltage drop across said cathode circuit due to flow of plate current of said power amplifier electron tube means therein constituting less than the desired amount of cathode bias for the latter device, an external bias-stabilizing voltage means connected to said cathode circuit for providing current flow in said cathode circuit which is in the same direction as the direction of plate current flow therein and which raises the total voltage drop in said cathode circuit to the desired voltage level, the total current flowing through said filament means being in the neighborhood of the recommended current for said filament means.

10. In an amplifier having pre-amplifier means including an electron tube amplifying means with electron-generating filament means and power amplifier means including electron tube amplifying means with an output current vs. signal input characteristic having a non-linear section at the cut-off end thereof and including plate, indirectly heated cathode and control grid electrode means, an output circuit connected between said plate electrode means and a common point and including a load device and a source of direct current plate voltage, and a signal input circuit connected to said control grid electrode means, the improvement comprising: a cathode circuit connected between said cathode electrode means and said common point and including said filament means of said preamplifier electron tube means which is arranged to be heated by the plate current of said power amplifier electron tube means, and means for stabilizing the voltage developed in said cathode circuit so that it is substantially independent of any variation in the average value of the plate current brought about by the driving of said power amplifier electron tube means into said non-linear region of operation thereof, said stabilizing means including a source of fixed bias voltage having a value near the value of the cathode bias voltage desired and connected through a relatively low impedance path to said cathode circuit including said filament means in said cathode circuit for providing the desired bias for said power amplifier electron tube means.

References Cited in the file of this patent

UNITED STATES PATENTS

| | | |
|---|---|---|
| 2,259,471 | Jahns | Oct. 21, 1941 |
| 2,542,293 | Smith | Feb. 20, 1951 |
| 2,759,050 | Lord | Aug. 14, 1956 |

FOREIGN PATENTS

| | | |
|---|---|---|
| 281,319 | Great Britain | Aug. 16, 1928 |
| 716,873 | Great Britain | Oct. 13, 1954 |

OTHER REFERENCES

Smith: "Heater Supplies for Hum Reduction" in Audio Engineering, August 1948, pages 26–28 (particularly first paragraph middle column of page 26).

"R.C.A. Receiving Tube Manual," published by the Tube Division of R.C.A. of America, Harrison, N.J., copyright 1956, page 321 Fig. 18–2 relied upon.